(12) United States Patent
Sato et al.

(10) Patent No.: US 9,442,370 B2
(45) Date of Patent: Sep. 13, 2016

(54) IMPRINTING METHOD, IMPRINTING APPARATUS, AND DEVICE MANUFACTURING METHOD

(71) Applicant: CANON KABUSHIKI KAISHA, Tokyo (JP)

(72) Inventors: Hiroshi Sato, Utsunomiya (JP); Mitsuru Hiura, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/284,974

(22) Filed: May 22, 2014

(65) Prior Publication Data

US 2014/0346700 A1  Nov. 27, 2014

(30) Foreign Application Priority Data

May 27, 2013  (JP) ................................. 2013-111351

(51) Int. Cl.
*G03F 7/00* (2006.01)
*G03F 7/20* (2006.01)
*G03F 9/00* (2006.01)

(52) U.S. Cl.
CPC ......... *G03F 7/0002* (2013.01); *G03F 7/70775* (2013.01); *G03F 9/7003* (2013.01); *G03F 9/708* (2013.01); *G03F 9/7088* (2013.01)

(58) Field of Classification Search
None
See application file for complete search history.

(56) References Cited

U.S. PATENT DOCUMENTS 6,921,615 B2 * 7/2005 Sreenivasan ........ B29C 35/0888
430/22
7,846,266 B1   12/2010 Dibiase 2007/0176320 A1 * 8/2007 Nakamura ............ B82Y 10/00
264/219
2008/0191372 A1   8/2008 Takaoka
2009/0267267 A1  10/2009 Yoneda
2010/0072647 A1   3/2010 Tokue
2010/0072664 A1   3/2010 Kawakami
2012/0313293 A1  12/2012 Wakabayashi

FOREIGN PATENT DOCUMENTS

| JP | 2005-116978 A | 4/2005 |
|---|---|---|
| JP | 2006-165371 A | 6/2006 |
| JP | 2007-103924 A | 4/2007 |
| JP | 2007-230229 A | 9/2007 |
| JP | 2007-281072 A | 10/2007 |
| JP | 2009-088264 A | 4/2009 |
| JP | 2009-266841 A | 11/2009 |
| JP | 2010-225693 A | 10/2010 |

(Continued)

*Primary Examiner* — Benjamin Schiffman
(74) *Attorney, Agent, or Firm* — Canon USA, Inc. IP Division

(57) ABSTRACT

An imprinting method of this disclosure includes supplying an imprint material on a substrate having a pattern including a mark on the substrate formed thereon; bringing a mold having a pattern including a mark on the mold into contact with the imprint material; curing the imprint material in a state in which the mold is in contact therewith; and forming a pattern including the mark on the imprint material, and characterized in that an optical system configured to form an image of the mark on the imprint material and an image of the mark on the substrate are used to detect the mark on the imprint material and the mark on the substrate after the space between the substrate and the mold has been increased until the mark on the mold is positioned out of a focal depth of the optical system, thereby obtaining a relative positional deviation between the pattern on the substrate and the pattern on the imprint material.

10 Claims, 7 Drawing Sheets

(56) References Cited

FOREIGN PATENT DOCUMENTS

| JP | 2012-186390 A | 9/2012 |
| JP | 2013-008911 A | 1/2013 |
| JP | 2013-026436 A | 2/2013 |
| KR | 10-2003-0079909 A | 10/2003 |
| KR | 10-2008-0103834 A | 11/2008 |
| KR | 10-2012-0098427 A | 9/2012 |
| KR | 10120102014 A | 9/2012 |
| KR | 10-2013-0009630 A | 1/2013 |

* cited by examiner

FIG. 1
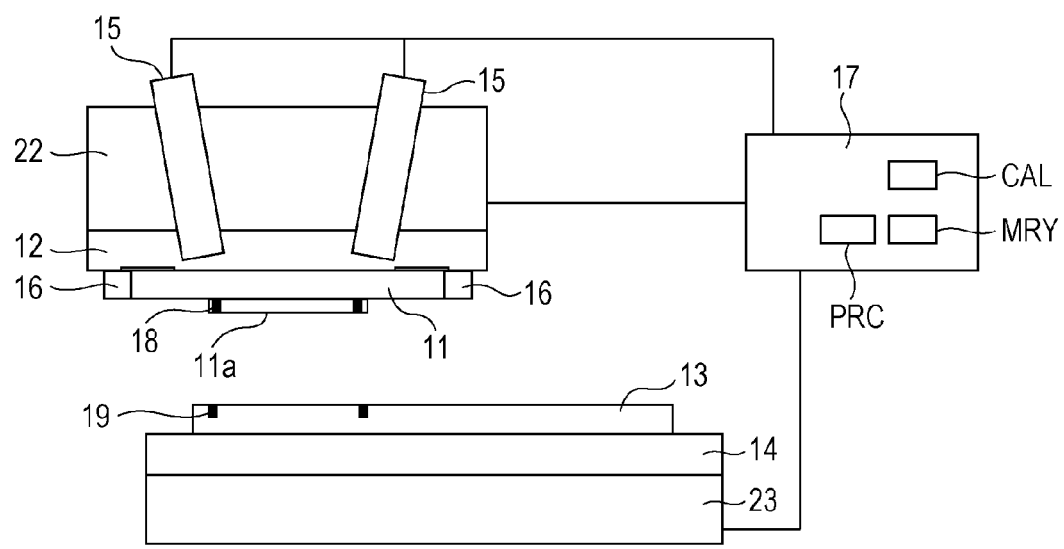
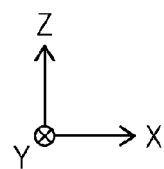

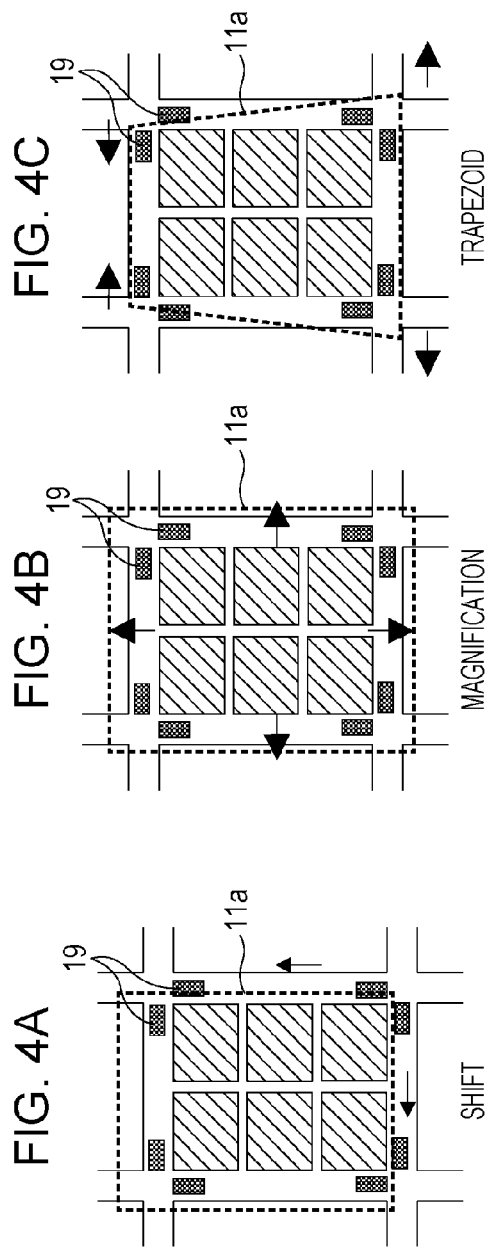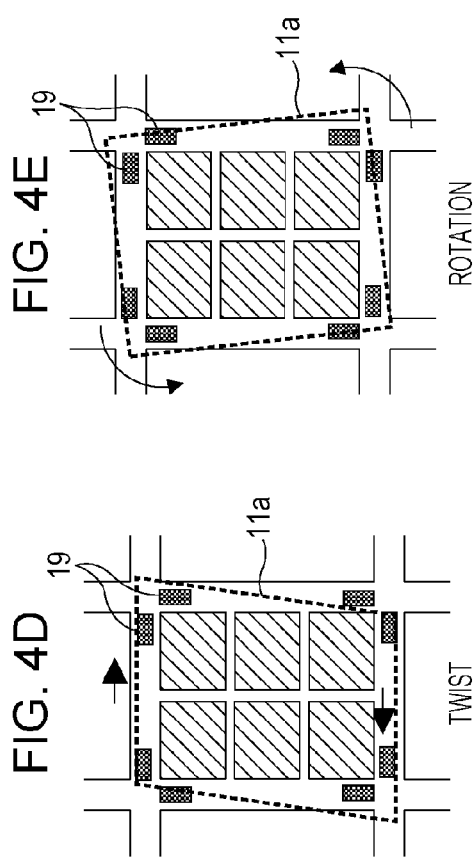

IMPRINTING METHOD, IMPRINTING APPARATUS, AND DEVICE MANUFACTURING METHOD

BACKGROUND OF THE INVENTION

1. Field of the Invention

This disclosure relates to an imprinting method, an imprinting apparatus, and a device manufacturing method configured to detect alignment marks for inspecting alignment between a pattern formed by imprinting and a pattern in a shot area on a substrate.

2. Description of the Related Art

An imprinting technology is a technology that forms a pattern formed on a mold on an imprint material on a substrate, and is proposed as one of lithography technologies for manufacturing semiconductor devices or magnetic storage media (Japanese Patent Laid-Open No. 2007-281072). An imprinting apparatus is configured to bring the mold including a pattern surface having a pattern formed thereon into contact with an imprint material (for example, a light curing resin), and causes the imprint material to be cured in the contact state. The space between the cured imprint material and the mold is increased and the mold is released from the imprint material, so that a pattern is formed on the imprint material on the substrate.

With the imprinting apparatus configured as described above, a die-by-die alignment system is generally used as an alignment method between the mold and the substrate. The die-by-die alignment system is configured to detect a plurality of alignment marks formed in a plurality of shot areas formed on the substrate and a plurality of alignment marks formed on the mold from one shot area to another. As a scope of detection of the alignment marks includes a configuration provided with a sensor configured to detect images of marks and an optical system configured to form images of the marks on the sensor.

In the imprinting technology, even by performing the alignment between the pattern in the shot area and the pattern surface of the mold on the basis of the die-by-die alignment system, pressing the mold, and curing the imprint material, a relative positional deviation is generated between the pattern in the shot area and the transferred pattern after the cure. Therefore, it is necessary to inspect (overlay inspection) the relative positional deviation between the pattern in the shot area and the transferred pattern after the pattern of the mold has been transferred to the imprint material.

Accordingly, in Japanese Patent Laid-Open No. 2009-88264, a configuration in which an amount of relative positional deviation between marks formed on a base pattern on a substrate in advance and marks transferred to a resin applied to the substrate is measured by an alignment sensor provided in the imprinting apparatus is described.

When performing an overlay inspection by using a scope provided with a sensor and an optical system configured to form mark images on the sensor, if an attempt is made to detect the marks after the space between the imprint material and the mold has been increased, the alignment marks formed on the mold are positioned within a field of view of the scope. Therefore, detection accuracy for detecting the marks formed in advance in the respective shot areas required for the overlay inspection and the marks formed on the imprint material is affected.

SUMMARY OF THE INVENTION

This disclosure provides an imprinting method which allows an improvement of accuracy of overlay inspection after a space between an imprint material and a mold has been increased.

An imprinting method disclosed herein includes: a supply process configured to supply an imprint material on a substrate having a shot area including a pattern having a mark on the substrate formed thereon; a contact process configured to bring a mold having a pattern including a mark of the mold into contact with the imprint material; a curing process configured to cure the imprint material in a state in which the mold is in contact therewith; and a forming process configured to form a pattern including the mark on the imprint material formed by the mark on the mold transferred thereto by increasing a space between the imprint material and the mold, wherein a sensor and an optical system configured to form an image of the mark on the imprint material and an image of the mark on the sensor by light passing through the mold are used to detect the mark on the imprint material and the mark on the substrate by the sensor after the space between the imprint material and the mold has been increased until the mark on the mold is positioned out of a focal depth of the optical system, thereby obtaining a relative positional deviation between the pattern on the substrate and the pattern on the imprint material.

Further features of the present invention will become apparent from the following description of exemplary embodiments with reference to the attached drawings.

BRIEF DESCRIPTION OF THE DRAWINGS

FIG. 1 illustrates an imprinting apparatus of this disclosure.

FIGS. 4A to 4E are drawings illustrating relative positional deviations between a pattern on the substrate and a pattern on the mold.

DESCRIPTION OF THE EMBODIMENTS

Figure 2:
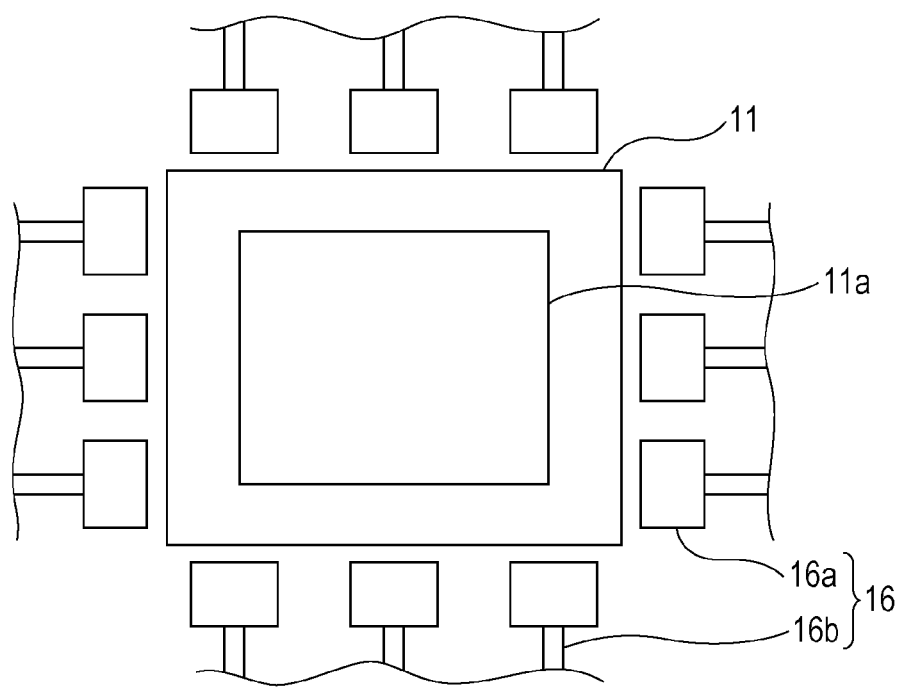
FIG. 2 illustrates a correcting mechanism of the imprinting apparatus.

Referring now to the attached drawings, the embodiments of this disclosure will be described in detail. In the respective drawings, the same components are denoted by the same reference numerals and duplicated description will be omitted.

FIG. 1 is a drawing illustrating an imprinting apparatus 1 of an embodiment. The imprinting apparatus 1 is a lithography apparatus used in a process of manufacturing semiconductor devices or the like. The imprinting apparatus 1 includes a mold holding unit 12 configured to hold a mold 11 (original plate, mold), a substrate holding unit 14 configured to hold a substrate 13, detecting units 15, correcting mechanisms 16, and a control unit 17. The imprinting apparatus 1 further includes a mold stage 22 (mold drive unit) configured to move the mold holding unit 12, and a substrate stage 23 (substrate drive unit) configured to move the substrate holding unit 14. The imprinting apparatus 1, although illustration is omitted, also includes a supply unit (dispenser) configured to supply an imprint material (uncured resin) on the substrate 13, a bridge platen for holding the mold stage 22, and a base platen configured to hold the substrate stage 23.

In the embodiment disclosed here, imprinting on the basis of a light curing method that transfers a pattern formed on the mold 11 by using a UV-cured resin that is cured by an irradiation of an ultraviolet ray as an imprint material will be described. The imprinting apparatus 1 cures the imprint material by irradiating the imprint material with an ultraviolet ray from a light source, which is not illustrated, in a state in which the imprint material supplied onto the substrate 13 and the mold 11 having a pattern formed thereon are in contact (pressed) with each other. The imprinting apparatus 1 performs an imprinting process that forms (transfers) a pattern on the imprint material by increasing a space (releasing) between the cured imprint material and the mold 11.

The mold 11 has a pattern surface 11*a* on which a pattern to be transferred to the imprint material is formed into a three-dimensional shape. The mold 11 is formed of a material (for example, quartz) that allows the ultraviolet ray with which the imprint material on the substrate 13 is irradiated to pass through. Mold-side marks 18 (first alignment marks) are formed on the pattern surface 11*a*.

The mold holding unit 12 is a holding mechanism configured to hold the mold 11, and includes a mold chuck configured to adsorb the mold 11 by vacuum contact or electrostatic contact. The mold stage 22 drives the mold holding unit 12 (mold 11) in at least a Z-axis direction (direction of pressure applied when the imprint material on the substrate 13 and the mold 11 are brought into contact (pressing direction) and a direction of increasing the space between the imprint material and the mold 11 (releasing direction). The mold holding unit 12 may have a function to drive not only in the Z-axis direction, but also in an X-axis direction, a Y-axis direction, and a θ (rotation about the Z-axis) direction.

The substrate 13 is a substrate on which the pattern formed on the pattern surface 11*a* is transferred and formed, and includes, for example, a monocrystal silicon wafer and SOI (Silicon on Insulator) wafer. The imprint material is supplied (applied) to the substrate 13 from the supply unit. Substrate-side marks 19 (second alignment marks) are formed in the shot area of the substrate 13 to which the pattern is to be transferred. When a plurality of the shot areas are arranged on the substrate 13, the substrate-side marks 19 are formed in the respective shot areas. When bringing the pattern formed on the mold into contact with the resin, alignment between the mold and the substrate is performed by using the mold-side marks 18 and the substrate-side marks 19.

The substrate holding unit 14 is a holding mechanism configured to hold the substrate 13, and includes a substrate chuck configured to adsorb the substrate 13 by vacuum contact or electrostatic contact. The substrate stage 23 drives the substrate holding unit 14 (substrate 13) in the X-axis direction and the Y-axis direction (the directions orthogonal to the pressing direction and the releasing direction of the mold 11). The substrate stage 23 may have a function to drive the substrate 13 in the X-axis direction and the θ (rotation about the Z-axis) direction in addition to the X-axis direction and the Y-axis direction. In the embodiment, the mold 11 is brought into the imprint material by bringing the mold 11 to the substrate 13. However, it may be achieved by moving the substrate 13 toward the mold 11, or by moving the mold 11 and the substrate 13 toward each other.

In FIG. 1, two of the detecting units 15 are provided. In the following description, however, one of the detecting unit 15 will be described as a representative for the sake of simplicity of description. The detecting unit 15 is composed of a scope configured to optically detect (observe) the mold-side marks 18 formed on the mold 11 and the substrate-side marks 19 formed in the shot area on the substrate 13 by using detection light passing through the mold 11. What is essential is that the detecting unit 15 detects the mold-side marks 18 and the substrate-side marks 19, so that the relative positional deviation between the mold 11 and the substrate 13 is obtained from the result of detection. Therefore, the detecting unit 15 may be composed of an image-pickup unit (sensor) that picks up images of the mold-side marks 18 and the substrate-side marks 19 simultaneously or a scope provided with an optical system for causing the image-pickup unit to form an images of the marks. In this manner, detecting the marks with the detecting unit 15 means picking up images of marks formed by the optical system with the sensor in a state in which the focus of the optical system is aligned with the marks. In addition, the detecting unit 15 may be composed of a scope configured to detect an interference signal which reflects the relative position between the mold 11 and the substrate 13 such as moiré signal generated by the mold-side marks 18 and the substrate-side marks 19.

The detecting unit 15 does not have to be able to detect the mold-side marks 18 and the substrate-side marks 19 simultaneously. For example, the detecting unit 15 may obtain the relative positional deviation between the mold-side marks 18 and the substrate-side marks 19 by detecting the mold-side marks 18 and the substrate-side marks 19 with respect to the reference position arranged inside the detecting unit, and obtaining the respective positions. The detecting unit 15 is arranged in a slanted manner so as not to block an optical path of the ultraviolet ray from the light source, but this disclosure is not limited thereto. For example, the detecting unit 15 may be arranged without being slanted if a mirror is configured to have characteristics that allow the ultraviolet to pass therethrough and reflect visible light so as to detect light reflected from the mirror.

As illustrated in FIG. 2, the imprinting apparatus 1 may be provided with the correcting mechanisms 16 (deforming unit). For example, the correcting mechanisms 16 (deforming unit) applies a force on a side surface of the mold 11 in a direction parallel to the pattern surface 11*a* to deform the pattern surface 11*a* (the pattern shape) in the direction parallel to the pattern surface (XY surface). In this case, the correcting mechanisms 16 includes a contact portion 16*a* that comes into contact with the side surface of the mold 11, and an actuator 16*b* configured to drive the contact portion 16*a* in the directions toward (pressing direction) and away (pulling direction) from the side surface of the mold 11. However, the correcting mechanisms 16 may be provided with a heating unit, and may deform the pattern surface 11*a* in the direction parallel to the pattern surface by providing the mold 11 with heat and controlling the temperature of the mold 11.

The control unit 17 includes a memory MRY in which a program for controlling the operation of the imprinting apparatus 1 is stored, a processor PRC configured to execute the program stored in the memory MRY, and a calculating unit CAL configured to calculate the relative position of the mold and the substrate by using the result of detection of the detecting unit 15. Signals for controlling the respective units which constitute the imprinting apparatus 1 are output in accordance with the executed program. The relative positional deviation between the mold 11 and the substrate 13 is obtained by a calculating unit CAL of the control unit 17 on the basis of the result of detection between the mold-side marks 18 and the substrate-side marks 19 detected by the detecting unit 15. The control unit 17 outputs a signal for driving the mold stage 22 or the substrate stage 23 with the result of calculation by the calculating unit CAL as an input value. On the basis of the signal output from the control unit 17, the relative position between the mold 11 and the substrate 13 is changed by the movement of the mold stage 22 or the substrate stage 23, whereby the alignment between the mold 11 and the substrate 13 is achieved. Both of the mold stage 22 and the substrate stage 23 may be driven simultaneously or in sequence. In addition, the control unit 17 controls the amount of deformation of the pattern surface 11a of the mold 11 by the correcting mechanisms 16 when forming a pattern by the imprinting apparatus 1.

Figure 3A:
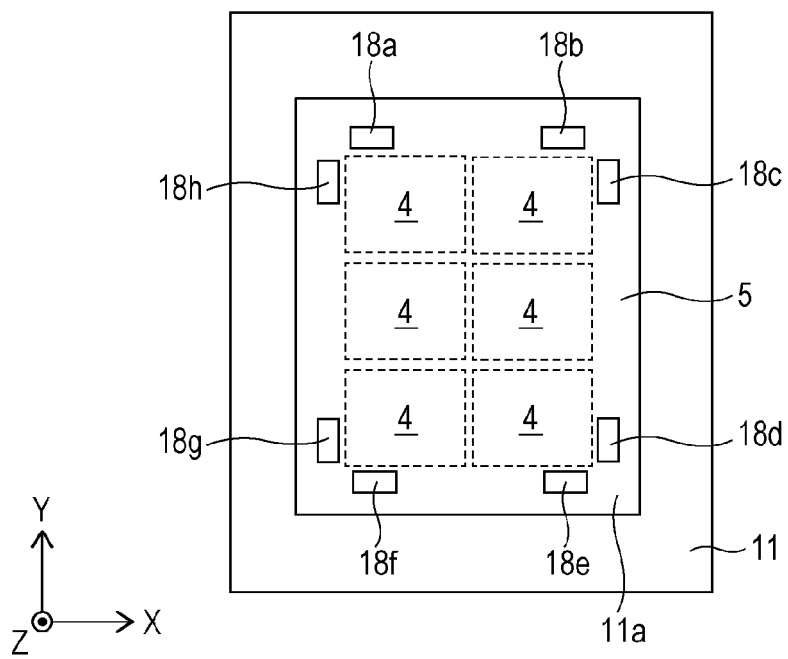
FIGS. 3A and 3B are drawings illustrating arrangement of marks on a mold and marks formed on a substrate.
Figure 3B:
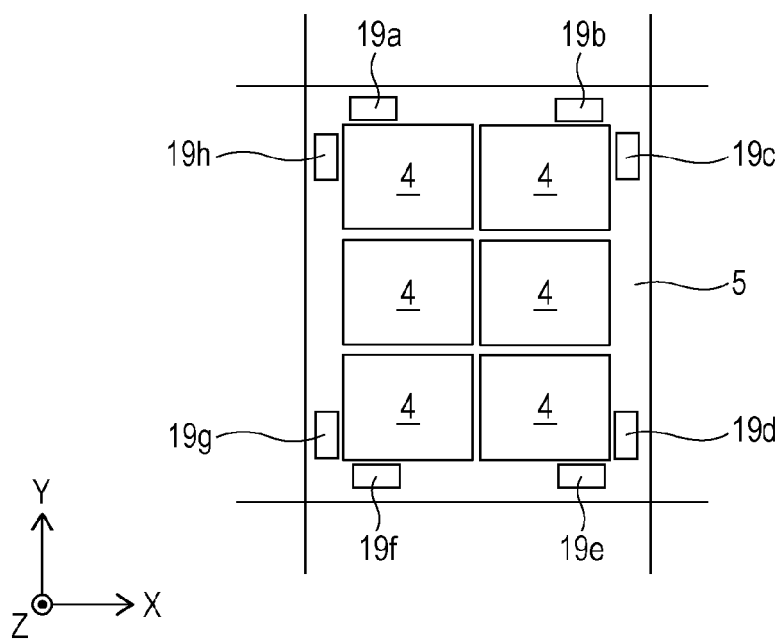

Referring now to FIGS. 3A and 3B, alignment marks used for alignment between the mold 11 and the substrate 13 will be described. FIG. 3A illustrates the mold-side marks 18 formed on the pattern surface 11a of the mold 11. FIG. 3B illustrates the substrate-side marks 19 formed on the shot area on the substrate 13. In the embodiment, it is assumed that six chip areas are arranged in one shot area.

As illustrated in FIG. 3A, mold-side marks 18a to 18h are formed on the pattern surface 11a of the mold 11. The mold-side marks 18a, 18b, 18e, and 18f having a longitudinal direction in the X-axis direction are marks having a measuring direction in the X-axis direction. In the same manner, the mold-side marks 18c, 18d, 18g, and 18h having a longitudinal direction in the Y-axis direction are marks having a measuring direction in the Y-axis direction. In FIG. 3A, the areas surrounded by dot lines indicate six chip areas 4, and a pattern to be transferred is formed in each of the chip areas 4. In the embodiment, an area where the six chip areas 4 are formed and an area where the mold-side marks 18 are formed (the pattern surface 11a) are collectively defined as the shot area 5.

As illustrated in FIG. 3B, a circuit pattern and the substrate-side marks 19a to 19h are formed in the each shot area 5 on the substrate 13. The substrate-side marks 19a, 19b, 19e, and 19f having the longitudinal direction in the X-axis direction are marks having the measuring direction in the X-axis direction. The substrate-side marks 19a, 19b, 19e, and 19f correspond to the mold-side marks 18a, 18b, 18e, and 18f illustrated in FIG. 3A. The corresponding mold-side mark and the substrate-side mark are used to obtain the relative positional deviation in the X direction between the mold and the substrate. The substrate-side marks 19c, 19d, 19g, and 19h having a longitudinal direction in the Y-axis direction are marks having the measuring direction in the Y-axis direction. The substrate-side marks 19c, 19d, 19g, and 19h correspond respectively to the mold-side marks 18c, 18d, 18g, and 18h illustrated in FIG. 3A. The relative positional deviation in the Y direction between the mold and the substrate is obtained by using these corresponding mold-side marks and the substrate-side marks. In FIG. 3B, areas surrounded by solid lines inside the shot area 5 indicate the six chip areas 4.

When forming a pattern on the substrate 13 by the imprinting apparatus 1, that is, when the mold 11 is brought into contact with the imprint material on the substrate 13, the mold-side marks 18a to 18h and the substrate-side marks 19a to 19h corresponding thereto are positioned close to each other. Therefore, the relative positional deviation between the pattern surface 11a of the mold 11 and the shot area 5 of the substrate 13 may be obtained by detecting the mold-side marks 18 and the substrate-side marks 19 by the detecting unit 15. When the relative positional deviation between the pattern surface 11a of the mold 11 and the shot area 5 on the substrate 13 is generated, a defective transfer of the pattern (defective product) may result.

Referring now to FIGS. 4A to 4E, the relative positional deviation between the pattern surface 11a of the mold 11 and the shot area 5 of the substrate 13 in imprinting will be described. Here, the relative positional deviation between the mold 11 and the substrate 13 means generation of deviation (error) in position (shift) or shape (magnification) between the pattern surface 11a of the mold 11 and the shot area 5 of the substrate 13. The detecting unit 15 detects the plurality of mold-side marks 18 and the substrate-side marks 19 respectively, and on the basis of the result of the detection, the calculating unit CAL obtains the relative positional deviation between the mold 11 and the substrate 13. FIGS. 4A to 4E are drawings illustrating the relative positional deviations generated between the pattern surface 11a of mold 11 and the shot area 5 on the substrate 13 (hereinafter, referred to also as "deviation between the mold 11 and the shot area 5"). The deviation between (the pattern of) the mold 11 and (the pattern of) the shot area 5 includes shifts, magnification deviations, and rotations. By obtaining the relative positional deviations (amount of positional deviation) of the mold-side marks 18 with respect to the substrate-side marks 19, components of the deviation between the mold 11 and the shot area 5 are known.

FIG. 4A illustrates a case where the deviation between the mold 11 and the shot area 5 is the shift. When the mold-side marks 18 and the substrate-side marks 19 detected by the detecting unit 15 is shifted in one direction, respectively, the deviation between the mold 11 and the shot area 5 is estimated to be the shift.

FIG. 4B illustrates a case where the deviation between the mold 11 and the shot area 5 is the magnification deviation. When the respective mold-side marks 18 detected by the detecting unit 15 is deviated uniformly outward or inward with respect to the substrate-side marks 19 and a center of the shot area 5, the deviation between the mold 11 and the shot area 5 may be estimated to be the magnification deviation.

FIG. 4C illustrates a case where the deviation between the mold 11 and the shot area 5 is a trapezoidal deviation. The respective mold-side marks 18 detected by the detecting unit 15 is deviated outward or inward with respect to the substrate-side marks 19 and the center of the shot area 5. When the directions of deviation are different between above and below or between the left and the right of the shot area 5, the deviation between the mold 11 and the shot area 5 may be estimated to be the trapezoidal deviation.

FIG. 4D illustrates a case where the deviation between the mold 11 and the shot area 5 is twisting. When the directions of deviation of the mold-side marks 18 detected by the detecting unit 15 with respect to the substrate-side marks 19 are different between above and below or between the left and the right of the shot area 5, the deviation between the mold 11 and the shot area 5 is estimated to be the twisting.

FIG. 4E illustrates a case where the deviation between the mold 11 and the shot area 5 is the rotation. When the directions of deviation of the mold-side marks 18 detected by the detecting unit 15 with respect to the substrate-side marks 19 are different among above, below, the left and the right of the shot area 5 and the deviation draws a circle about a certain point in the shot area 5, the deviation between the mold 11 and the shot area 5 is estimated to be the rotation.

As illustrated in FIG. 4A, when the deviation between the mold 11 and the shot area 5 is the shift, the control unit 17 moves the mold stage 22. Specifically, the detecting unit 15 detects the mold-side marks 18 and the substrate-side marks 19, and the calculating unit CAL of the control unit 17 obtains the relative positional deviation with respect to the mold 11 on the basis of the result of the detection. The control unit 17 controls the amount of driving of the mold stage 22 from the obtained relative positional deviation so as to overlap the pattern surface 11a with the shot area 5 on the substrate. In addition to the mold stage 22, the substrate stage 23 may be moved simultaneously with the driving of the mold stage 22 or in sequence thereto. The positional deviation of the shift is corrected by driving at least one of the mold stage 22 and the substrate stage 23.

As illustrated in FIG. 4B to FIG. 4D, when the deviation between the mold 11 and the shot area 5 is the magnification deviation, the trapezoidal deviation, or the twisting, the control unit 17 deforms the shape of the pattern surface 11a of the mold 11 by the correcting mechanisms 16. Specifically, the mold-side marks 18 and the substrate-side marks 19 are detected by the detecting unit 15, and the calculating unit CAL of the control unit 17 obtains the relative positional deviation between the mold 11 and the substrate 13 on the basis of the result of the detection. The control unit 17 controls the amount of deformation of the pattern surface 11a by the correcting mechanisms 16 so that the shape of the pattern surface 11a becomes the shape of the shot area 5 on the substrate from the obtained relative positional deviation. Alignment between the mold 11 and the shot area 5 is achieved by deforming the pattern surface 11a by the correcting mechanisms 16 and moving the substrate 13 (shot area) by the substrate stage 23. It is also possible to acquire data indicating the correspondence relationship between the amount of driving of the actuator 16b (that is, a force applied to the mold 11) and the amount of deformation of the pattern surface 11a in advance, and store the same in the memory MRY of the control unit 17. The control unit 17 is configured to obtain the amount of driving of the actuator 16b corresponding to the amount of deformation of the pattern surface 11a on the basis of the data stored in the memory MRY and drive the actuator 16b.

In addition, as illustrated in FIG. 4E, when there is a rotational difference between the mold 11 and the shot area 5, the control unit 17 can correct the rotational difference by rotating one or both of the mold holding unit 12 and the substrate stage 23.

As described thus far, alignment of the mold 11 and the shot area 5 and correction of the shape of the pattern surface 11a are performed, and then the pattern formed on the mold 11 is transferred to the imprint material on the substrate 13.

Figure 5A:
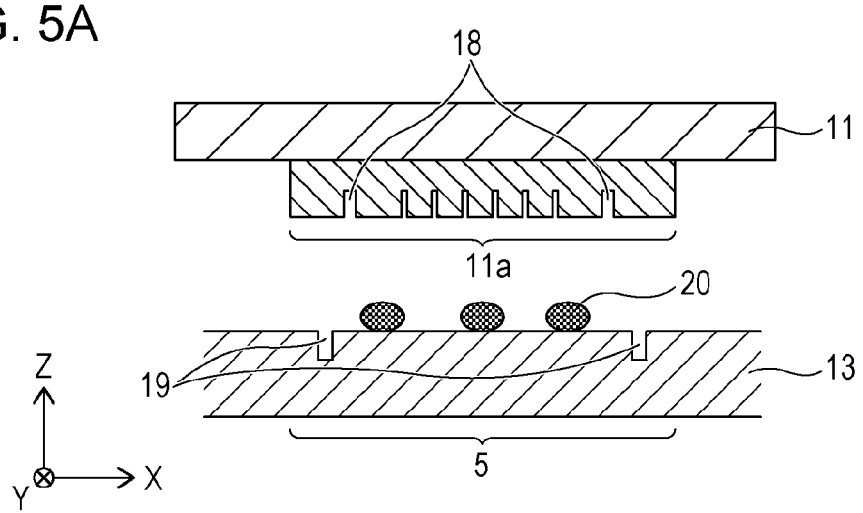
FIGS. 5A to 5C are drawings illustrating an imprinting process of this disclosure.
Figure 5B:
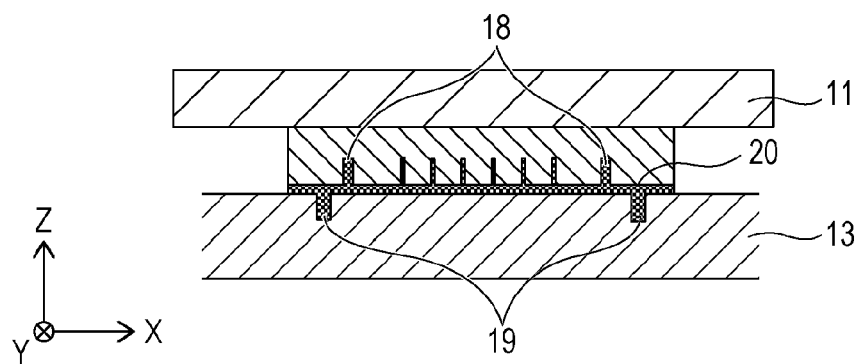
Figure 5C:
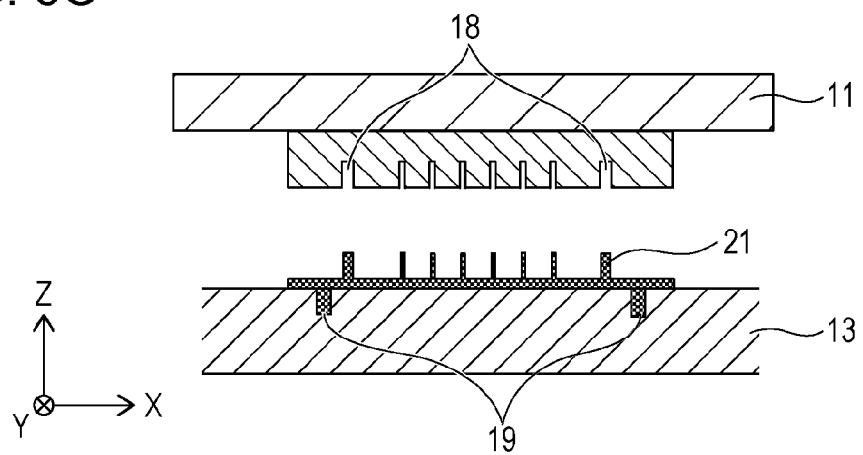

FIG. 5 illustrates an imprinting process for transferring the pattern formed on the pattern surface 11a of the mold 11 to the imprint material 20 on the substrate 13. FIGS. 5A to 5C illustrate states of the substrate 13 and the mold 11 viewed from cross sections, respectively.

As illustrated in FIG. 5A, the imprint material 20 is supplied to the shot area 5 on the substrate 13. Since the imprint material 20 is generally a highly-volatile resin, the imprint material 20 is supplied onto the substrate immediately before the imprinting process. If the imprint material is a low-volatile material, the imprint material may be supplied on the entire surface of the substrate (the plurality of shot areas arranged thereon) in advance by Spin Coat or the like. As described above, the relative positional deviation between the mold 11 and the substrate 13 is obtained by detecting the mold-side marks 18 and the substrate-side marks 19, and performs alignment by the correction of the movement of the shift of the substrate or the shape of the mold.

As illustrated in FIG. 5B, the mold 11 is brought into contact with the imprint material 20, and the pattern (concave-convex structure) formed on the mold 11 is filled with the imprint material 20. At this time, a detection light beam irradiated from the detecting unit 15 passes through the mold 11 and the imprint material 20, and hence the substrate-side marks 19 may be detected by the detecting unit 15. However, there is a case where the mold 11 and the imprint material 20 comes into contact with each other and the depressions of the pattern are filled with the resin, and hence the mold-side marks 18 cannot be measured. Even though the difference in index of refraction has been high because air is in contact with depressions of the mold-side marks 18 of the mold 11 before the contact between the mold 11 and the imprint material 20. However, since the difference in index of refraction is reduced by the resin filled in the depressions of the pattern, the mold-side marks 18 cannot be detected. Therefore, a method of applying a substance having different index of refraction and transmissivity from the material of the mold 11 on the mold-side marks 18 and changing the index of refraction of the mark portions by the irradiation of ion has been proposed. By using these methods, the mold-side marks 18 may be detected even in the state of FIG. 5B. The detecting unit 15 detects the mold-side marks 18 and the substrate-side marks 19, the pattern surface 11a and the shot area 5 on the substrate are aligned by using the driving of the mold stage 22 and the correcting mechanisms 16 as described above, and then the imprint material 20 is cured.

FIG. 5C illustrates a state in which the imprint material 20 is cured, then the space between the cured imprint material 20 and the mold 11 is increased to separate the mold 11 and the substrate (mold release). Here, a pattern formed on the pattern surface 11a is formed on the imprint material 20 and, simultaneously, the mold-side marks 18 are also transferred to the imprint material 20, and the transfer mark 21 (the third alignment mark) is formed on the substrate 13. The transfer mark 21 and the substrate-side marks 19 are detected after the mold release process, so that the relative positional deviation between (the pattern in) the shot area on the substrate and the pattern formed on the imprint material may be measured, that is, a so-called overlay inspection can be performed. In order to perform the overlay inspection after the mold release process, the detecting units 15 detect the transfer mark 21 and the substrate-side marks 19 in a state in which the mold 11 is still on the transfer mark 21 formed on the imprint material.

Since the mold-side marks 18 and the substrate-side marks 19 are detected by the detecting units 15 at the time of contact between the mold 11 and the imprint material 20, the transfer mark 21 and the substrate-side marks 19 present in the field of view may be detected by the detecting units 15 even after the mold release. In this manner, the overlay inspection of the pattern on an upper layer of the substrate 13 and the pattern on the lower layer immediately after the transfer of the pattern may be performed by the imprinting apparatus by using the detecting units 15 for alignment.

The detecting units 15 (scope) detects the mold-side marks 18 and the substrate-side marks 19 at the time of contact (pressing) by focusing on the substrate 13. Specifically, the optical system included in the detecting units 15 forms images of the mold-side marks 18 and the substrate-side marks 19. Therefore, when an attempt is made to detect the substrate-side marks 19 and the transfer mark 21 immediately after the release of the mold from the substrate, the mold-side marks 18 are positioned in a focal depth of each of the detecting units 15, and hence the overlay inspection may be affected. Accordingly, by increasing the space between the mold 11 and the substrate 13 sufficiently and arranging the (marks 18) of the mold 11 out of the focal depth of each of the detecting units 15, only the substrate-side marks 19 and the transfer mark 21 may be observed.

For example, when the marks 19 and 21 are detected with the detecting units 15 each having a scope with a detection NA of 0.1 by using detection light beam having a wavelength of 600 nm (visible light), the focal depth of the scope is ±30 µm. Therefore, when the focal position of the scope is on the surface of the substrate 13, the mold-side marks 18 are not detected by the detecting units 15 by increasing the space between the mold and the substrate to a space more than 30 µm.

Here the detecting units 15 do not necessarily have to be focused on the substrate 13 (the substrate-side marks 19), and the substrate-side marks 19 need only to be positioned within the focal depth of the detecting units 15. The substrate-side marks 19 need only to be positioned within the focal depth of the detecting units 15 at least after the (marks 18) of the mold 11 are positioned out of the focal depth of the detecting units 15. Alternatively, the space between the imprint material and the mold may be increased in a state in which the substrate-side marks 19 are positioned within the focal depth of the detecting units 15.

As described thus far, the detecting units 15 detect light passing through the mold 11 from the transfer mark 21 and the substrate-side marks 19 in a state in which the mold 11 is present on the transfer mark 21. A unit for obtaining the positional deviation (calculating unit CAL) measures the relative position between the transfer mark 21 and the substrate-side marks 19 after the mold release, that is, the overlay accuracy (overlay inspection) by using the result of detection of the detecting unit 15.

Figure 6:
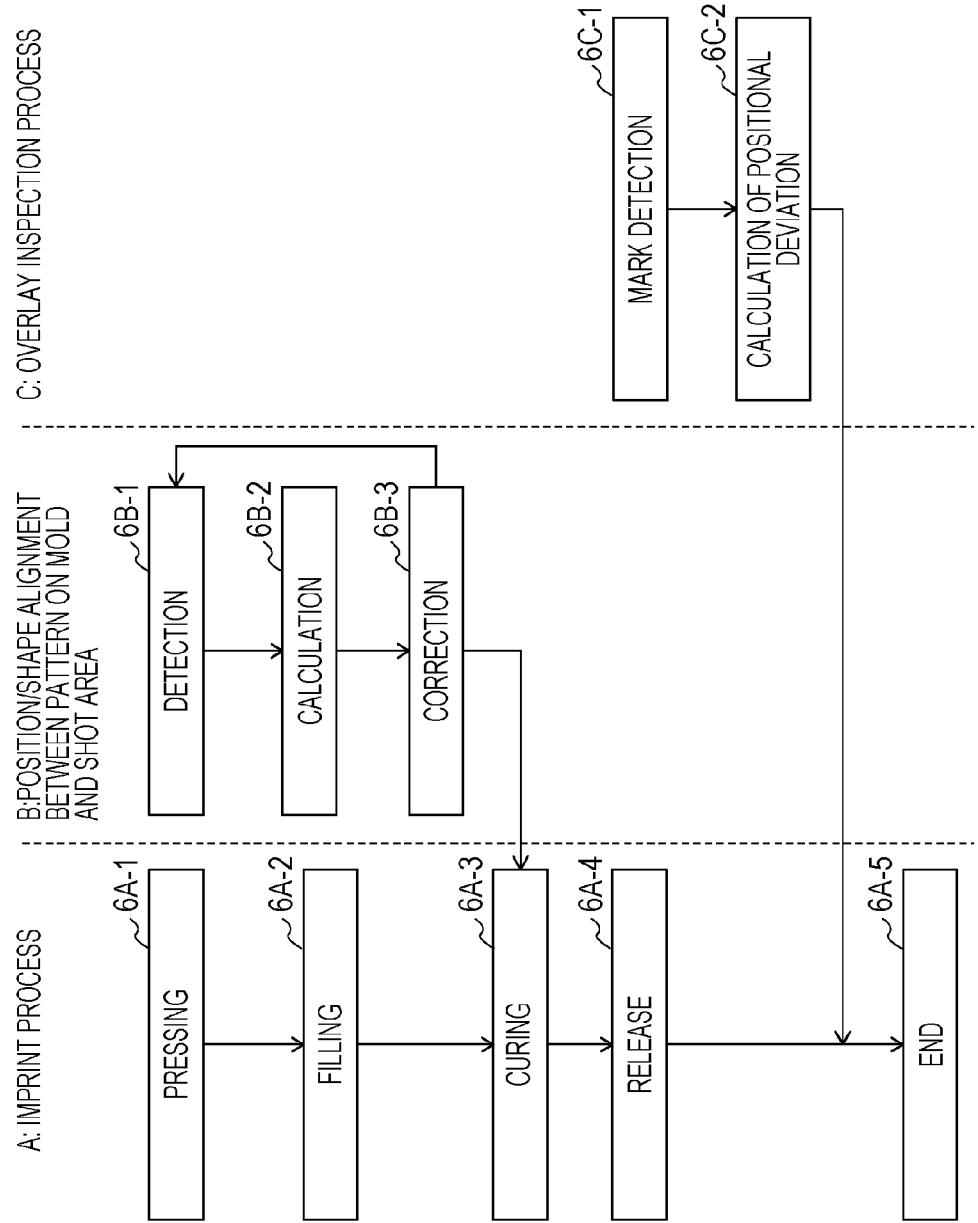
FIG. 6 is a drawing illustrating a flow of the imprinting process and an overlay inspection process of this disclosure.

FIG. 6 illustrates a flow of the imprinting process of the embodiment. The flow for describing the embodiment includes A: Imprinting Process, B: Position/Shape Alignment between the pattern of the mold and the shot area, and C: Overlay Inspection Process.

A: Imprinting Process is a process of forming (transferring) the pattern to the imprint material on the substrate by using the mold having a pattern formed thereon as illustrated in FIG. 5.

B: Position/Shape Alignment between the pattern of the mold and the shot area is a process of detecting the mold-side mark and the substrate-side mark, and measuring the relative position, thereby obtaining the differences in relative position and shape between the pattern of the mold and the shot area on the substrate, and correcting the difference.

C: Overlay Inspection Process is a process of detecting the transfer mark 21 and the substrate-side marks 19, thereby measuring the relative positional deviation between the pattern formed on the imprint material and the shot area on the substrate, and performing the overlay inspection.

First of all, the mold and the imprint material are brought into contact with each other (6A-1: Pressing Process), and the pattern formed on the mold (concavo-convex pattern) with a resin (6A-2: Filling Process). In parallel to a period from the pressing process and the filing process, if the detection of the mold-side marks 18 and the substrate-side marks 19 is enabled at the detecting units, detection of the mold-side marks 18 and the substrate-side marks 19 is started (6B-1, Detection Process). On the basis of the result of detection of the two marks, calculation of the relative position between the pattern of the mold and the shot area is started. In order to detect the two marks simultaneously, measurement can be started only after the space between the mold 11 and the substrate 13 has been sufficiently reduced. However, for example, the mold-side marks 18 are detected by the detecting units in advance, and the positions of the mold-side marks 18 with respect to references (for example, a light-receiving surfaces of the scopes) of the detecting units are measured and memorized. The substrate-side marks 19 are detected by the detecting units, and the positions of the substrate-side marks 19 with respects to the references of the detecting units are measured. Relative positions of the two marks may be obtained from the mold-side marks 18 and the substrate-side marks 19 detected by the detecting units in this manner.

On the basis of the result of the detection obtained by the detecting units 15 by detecting the plurality of mold-side marks 18 and the plurality of substrate-side marks 19 formed in the shot area on the substrate 13, the relative position or difference in shape between the (pattern of the) mold and the (pattern of the) substrate illustrated in FIG. 4 are calculated (6B-2: Calculating Process). The position and the shape of at least one of the mold and the substrate is corrected in accordance with the calculated difference in relative position and the shape (the differential amount) (6B-3: Correcting Process). The method of detecting the alignment marks and the method of correcting the mold may be performed by the method described in explanation in conjunction with FIG. 2 and FIG. 4.

The procedure may be returned back to the detection process (6B-1) in order to confirm whether the correction in the correction process (6B-3) is sufficient. The detection process, the calculation process, and the correction process are performed by a plurality of times, and when the fact that the sufficient correction is performed for required accuracy is confirmed, the imprint material is irradiated with ultraviolet light to cure the imprint material (6A-3: Curing Process).

When the imprint material is cured, the space between the cured imprint material and the mold is increased to separate the imprint material from the mold (6A-4: Mold Release Process). The space between the cured imprint material and the mold is increased by driving the mold stage 22 (mold drive unit) or the substrate stage 23 (substrate drive unit) from the state in which the cured imprint material and the mold are in contact with each other. The space between the imprint material and the mold may be increased by driving the mold stage 22 and the substrate stage 23 simultaneously or in sequence.

At this time, the space is increased so that the space between the mold and the substrate becomes larger than the focal depth of the optical systems of the detecting units. By separating the mold from the imprint material when aligning the focuses of the optical systems of the detecting units 15 with the substrate-side marks 19, the mold-side marks 18 are deviated from the focal depth of the optical systems of the detecting units 15, and hence become invisible. Or signals reflecting the relative position with respect to the substrate-side marks 19 such as interference signals that the mold-side marks 18 relate are not generated. In this configuration, the transfer mark 21 and the substrate-side marks 19 are detected by the detecting units 15 (6C-1: Mark Detection Process). The results of detection detected by the detecting units 15 are sent to the calculating unit CAL (unit for obtaining the relative positional deviation) of the control unit 17. On the basis of the results of detection detected by the detecting units 15, the calculating unit CAL can calculate the relative positional deviation (the overlay inspection) (6C-2: Positional Deviation Calculating Process).

In the mark detection process (6C-1), if the space between the mold 11 and the substrate 13 cannot be increased with respect to the focal depths of the optical systems of the detecting units 15, the mold 11 is moved (shifted) in the direction perpendicular to the releasing direction to a position where the mold-side marks 18 does not overlap with the transfer mark 21 and the substrate-side marks 19. The size of the alignment marks normally used for alignment is on the order of 100 μm. The mold 11 only needs to be moved in the direction parallel to the pattern surface 11a by a space not smaller than the size of the alignment mark. By moving the mold 11 so as to match the size of the alignment mark, two marks can be detected with the transfer mark 21 and the substrate-side marks 19 included within the detection field of view of the detecting unit 15, so that the relative positional deviation can be calculated. Although the mold 11 is moved in the direction parallel to the pattern surface 11a, the substrate 13 may be moved. In this case, the substrate 13 is moved so that the transfer mark 21 and the substrate-side marks 19 are not deviated from the field of view of detection of the detecting unit 15. As described above, even when the mold 11 is moved, the detecting unit 15 detects the transfer mark 21 and the substrate-side marks 19 via the mold 11 in a state in which the mold 11 is on the transfer mark 21.

The detecting method of the detection process (6B-1) and the calculating method of the calculating process (6B-2) may be applied to the detecting method in the mark detection process (6C-1) and the measuring method in the positional deviation calculating process (6C-2).

In this embodiment, since the relative positional deviation between the shot area on the substrate and the transferred pattern in each of the shot areas may be obtained immediately after the mold release process, the overlay inspection can be performed to the shot areas to which the patterns are transferred without lowering the productivity. After the termination (6A-5) of the imprinting process and the overlay inspection process, whether or not the formation of the pattern in the shot area on the substrate is completed is determined. If the pattern formation is not completed, the substrate 13 moves to the next shot area for the transfer of the pattern. In this manner, the overlay inspection is performed before starting a process of transferring the pattern to the shot area different from the shot area in which the pattern is already transferred.

In Process B in FIG. 6, since the imprinting is performed after the sufficient correction of the relative position/shape between the mold and the substrate by the alignment of the position and the shape between the pattern of the mold and the pattern of the shot area (6B-1 to 3), there must be little error. However, in Process C in FIG. 6, there is a case where the overlay accuracy is low (deviation is large) from the result of detection in Process C: Overlay Inspection Process (6C-1 to 2). The considerable reason is that there arises a relative positional deviation between the moment of measurement of alignment before the imprint material is cured and the moment of measurement of alignment after the imprint material has been cured in the imprinting process.

One of the causes of the relative positional deviation that occurs when the resin is cured is shrinkage of the resin. Since the resin shrinks in accordance with the curing of the resin from the start of curing of the resin until the resin is sufficiently cured, a stress is applied to the mold in association with the shrinkage of the resin. It was found that the relative positional deviation between the substrate and the mold occurred in the respective shot areas in the same direction because of the stress applied to the mold. There is no problem if the mold can be separated from the cured resin at the time of mold release. However, it was also found that if the mold was released at an angle with respect to a direction perpendicular to the surface of the substrate, a force was applied to the pattern in the XY direction, and hence the positional deviation resulted.

Therefore, the result of measurement obtained in the positional deviation calculating process (6C-2) may be added in the next shot area or in the calculation process (6B-2) from the next substrate onward as an offset. Feedback in a cycle shorter than that in a case where the overlay inspection is performed after the patterns has been transferred in all of the shot areas in the related art is enabled, so that an improvement in accuracy of the overlay inspection is expected.

In addition since the result (data) of the overlay inspection can be used for figuring out the overlay accuracy in each of the shot areas or in the chip area, determination of acceptance as a product may be performed. It is possible to specify a shot area or a chip area for further detailed measurement on the basis of the result of measurement described above and measure with an overlay inspection apparatus having a higher accuracy. It is also possible to perform a simple inspection in the imprinting apparatus, and perform a detailed inspection by using the overlay inspection apparatus on the basis of the result of inspection. Since the inspection is performed only for the shot areas selected in advance, the time length required for the overlay inspection performed by the inspection apparatus may be shortened than the case where the inspection is performed for all the shot areas.

When the relative positional deviation between the pattern formed on the imprint material and the shot area on the substrate falls within an allowable range as a result of the overlay inspection to be performed in the imprinting apparatus, imprinting is performed on other shot areas by using the result of measurement obtained in the overlay calculating process. In contrast, when the relative positional deviation between the pattern formed on the imprint material and the shot area on the substrate is out of the allowable range, the relative positional deviation is measured by using an overlay inspection apparatus external to the imprinting apparatus to achieve a further accurate overlay inspection. When the relative positional deviation is out of the allowable range, formation of the pattern in the shot areas from then onward may be stopped.

Figure 7:
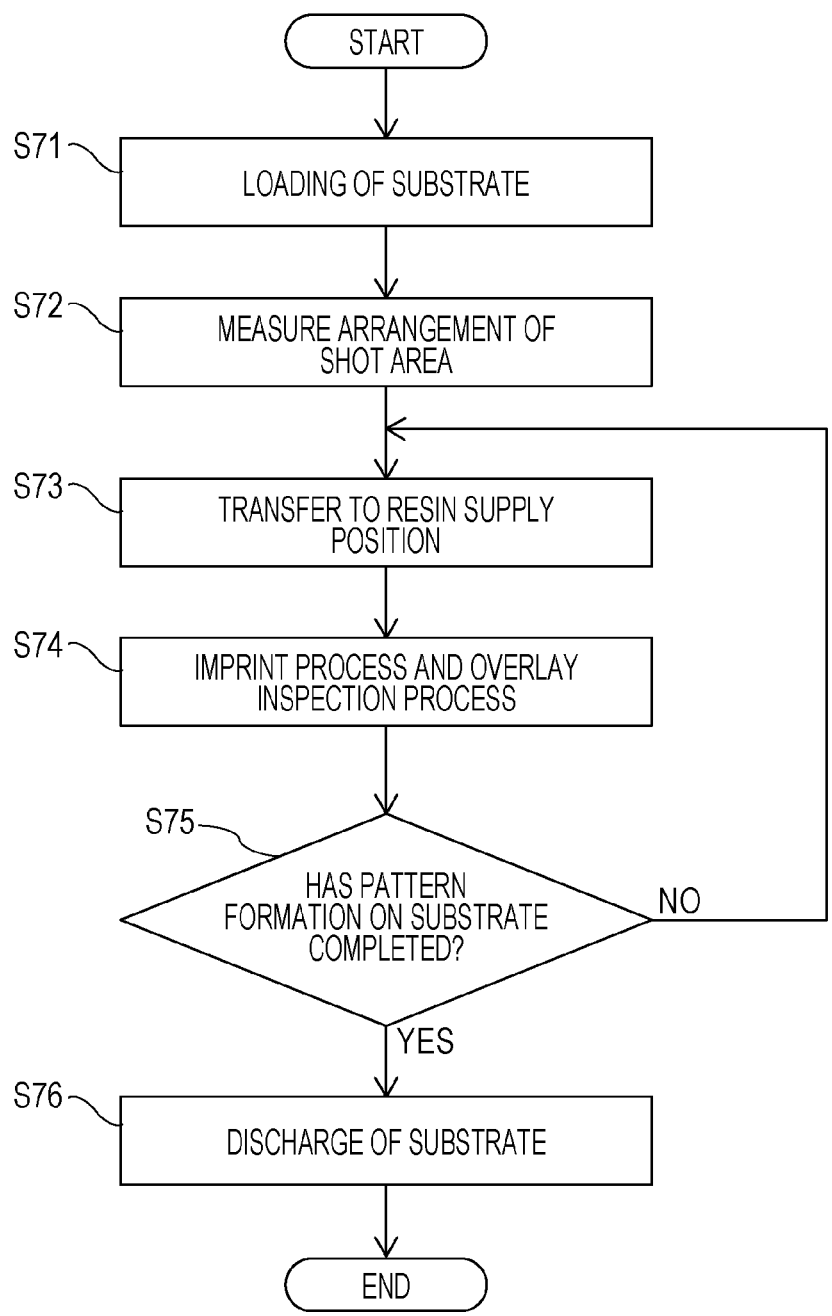
FIG. 7 is a drawing illustrating a flow of the imprinting operation of this disclosure.

FIG. 7 is a flowchart illustrating a series of flow of the imprinting action forming a pattern on the substrate by using the imprinting apparatus 1 of the embodiment. The imprinting operation illustrated in FIG. 7 is conducted by executing a program stored in the memory MRY provided in the control unit 17 illustrated in FIG. 1. A processor PRC provided in the control unit 17 processes the program stored in the memory MRY. In this manner, the imprinting action of this disclosure described above is executed in accordance with the program stored in the memory MRY of the control unit.

When the imprinting process is started, a substrate W is loaded in the imprinting apparatus 1 (S71). The substrate conveyance unit, which is not illustrated, places the substrate 13 on the substrate holding unit 14 from the outside of the imprinting apparatus 1.

When the substrate is loaded, an arrangement of the plurality of shot areas arranged on t e substrate 13 is measured (S72). Here, the detecting unit 15 detects the alignment marks formed on the substrate and obtains an array (position) of the shot areas on the substrate. Instead of the detecting unit 15, an off-axis alignment scope configured to detect the alignment marks without the intermediary of the mold 11 may be used.

After the measurement of the arrangement of the shot area, the substrate stage 23 moves for supplying a resin to the shot area to which the pattern is to be transferred (S73). By the movement of the substrate stage 23, the shot area to which the resin is to be applied is positioned below the supply unit.

When the substrate 13 is moved, the imprinting process and the overlay inspection process of the embodiment described above is performed (S74). In the imprinting process and the overlay inspection process, the respective processes described in FIG. 6 will be executed.

After the imprinting process and the overlay inspection process, whether or not the formation of the pattern in the shot area on the substrate has completed is determined (S75). When the pattern formation is not completed, the procedure goes back to S73, the substrate stage moves to apply the resin in the next shot area in which the pattern is to be formed, and the imprinting process and the overlay inspection process in S74 are repeated.

When the formation of the pattern is completed, the substrate W is discharged from the imprint apparatus 1 (S76). When the substrate conveyance unit, which is not illustrated, discharges the substrate 13 from the substrate holding unit 14 to the outside of the imprinting apparatus 1 and a series of the imprinting operation is terminated.

In the embodiment, the overlay inspection is performed by using the alignment marks used for the alignment between the mold and the substrate in the die-by-die alignment. However, the invention is not limited thereto. For example, the substrate-side marks 19 are formed at four corners of each of the shot areas. However, in the case of the shot area having a plurality of chip areas, the alignment marks may be formed at desired positions such as between the chip areas. In the embodiment, the marks 19 are arranged within the scribe line between the chip areas or between the shot areas.

It is also possible to drive the scope after the correction in the process B described in conjunction with FIG. 6 has been terminated and before the overlay inspection of the process C is started, and measure desired alignment marks (marks different from the marks used in the process B).

A scope different from the detecting unit 15 may be prepared in the imprinting apparatus for the overlay inspection. However, since the scope in this case performs detection of marks for the overlay inspection immediately after the mold release process, the scope is arranged in the mold stage 22 in the same manner as the detecting unit 15, so that the mark detection is achieved via the mold 11. The scope also needs to be arranged at a position which does not block a passage where light for curing the resin passes. In a case where the transfer mark 21 which is the mold-side marks 18 transferred to the imprint material 20 is used in the overlay inspection, the scope for the overlay inspection is arranged adjacent to the detecting unit 15.

Normally, the scope for the alignment is required to detect the mark (position) in a short time for improving the productivity. Since a many scopes are arranged in the apparatus and need to get closer to the position of the marks, a reduction in size (simplification) of the scopes is required. Therefore, a reduction of the time length required for detecting the marks (charge time) and a reduction (narrowing) of the field of view of the scope are required. When the overlay inspection is performed by using the scope for the alignment as described above, since the field of view is narrow, and the time length required for detecting the marks is short. Therefore, there is a case where a signal required for the overlay inspection is not obtained from the mark. With the provision of the scope for the overlay inspection in the imprinting apparatus, constraint may be alleviated in comparison with the scope for positioning such as increasing the time length for detecting the mark. Therefore, a larger number of marks may be detected, and overlay inspection on the basis of the detection of the larger number of marks is achieved.

The marks to be used in this disclosure needs to be formed in a limited space on the substrate. Therefore, it is desired that the marks used for alignment maybe used also as the marks of the overlay inspection. However, a mark optical for the overlay inspection may be formed separately as needed such as a case where the accuracy of the overlay inspection is required. In this case, if the alignment marks and the overlay inspection marks can be formed within the field of view of the detecting unit 15, implementation of the embodiment is not difficult. When the overlay inspection marks are at positions out of the field of view of the detecting unit 15, the substrate stage 23 or the detecting unit 15 is driven after the mold release, so that the detecting unit 15 can detect the overlay inspection marks.

In the embodiment, the alignment between the mold and the substrate in the die-by-die alignment has been described. However, the imprinting method of this disclosure is not limited to the die-by-die alignment. For example, a global alignment system configured to detect the marks formed in a plurality of shot area arranged on the substrate, obtain an array coordinate of the plurality of shot areas from the detected result, and performs alignment between the mold and the substrate on the basis of the obtained array coordinate is also applicable. After the alignment between the mold and the substrate has been performed by the global alignment system and the pattern formed on the mold is formed on the imprint material in the shot area on the substrate, and the relative positional deviation between the pattern on the substrate and the pattern of the imprint material is obtained in the above-described method. In the case of the global alignment system, when obtaining the array coordinate of the plurality of shot areas on a substrate different from the substrate the deviation of which has been obtained, the result of the obtained relative positional deviation is used. By using the result of relative positional deviation in addition to the result of detection of the marks formed in the plurality of shot areas, the relative positional deviation between the pattern on the substrate after the imprint material has been cured and the transferred pattern may be reduced.

In the embodiment, the light-cured imprinting in which the imprint material is cured by being irradiated with the ultraviolet light was described. The imprint material to be supplied onto the substrate may be determined as needed according to the wavelength of the light to be irradiated. This disclosure is not limited to the light-cured imprinting, but may be applied to a heat-cured imprinting in which the imprint material is cured by using heat.

Device Manufacturing Method

A method of manufacturing devices (semiconductor integrated circuit devices, liquid crystal display devices, etc.) includes a process of forming a pattern on a substrate (wafers, glass plates, film-type substrates) by using the imprinting apparatus described above. In addition, the manufacturing method may include a process of etching a substrate including a pattern formed thereon. When manufacturing other products such as pattern media (recording media) or optical elements, the manufacturing method may include other processes such as processing a substrate on which the pattern is formed instead of etching. A method of manufacturing the article of this disclosure is advantageous in at least one of a product performance, quality, productivity, and production cost in comparison with the method of the related art.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-111351 filed May 27, 2013, which is hereby incorporated by reference herein in its entirety.

What is claimed is:

1. An imprinting method for an imprinting apparatus, the imprinting method comprising:
   supplying an imprint material on a substrate, wherein the substrate includes a shot area and a pattern in the shot area having a substrate mark;
   bringing a mold having a pattern area and a mold mark into contact with the imprint material;
   curing the imprint material in a state in which the mold is in contact with the imprint material;
   forming, on the substrate, a pattern to the imprint material and an inspection mark to the imprint material by increasing a space between the substrate and the mold, and
   obtaining a relative positional deviation between the pattern in the shot area and the pattern formed to the imprint material;
   wherein, after the space between the imprint material and the mold has been increased to where the mold mark is positioned out of a focal depth of an optical system, the relative positional deviation between the pattern in the shot area and the pattern formed to the imprint material is obtained by detecting light from the inspection mark and light from the substrate mark using the optical system.

2. The imprinting method according to claim 1,
   wherein a plurality of shot areas are arranged on the substrate,
   wherein curing the imprint material and forming the pattern to the imprint material are executed after alignment between the mold and the substrate has been performed in the bringing the mold into contact with the imprint material for each of the shot areas, and
   wherein the relative positional deviation between a pattern in the shot area of the substrate obtained in a previous shot area and the pattern formed on the imprint material is used for alignment between the mold and the substrate in a subsequent shot area when forming patterns in sequence in the plurality of shot areas by obtaining the relative positional deviation between the pattern in the shot area of the substrate and the pattern formed to the imprint material.

3. The imprinting method according to claim 2, wherein, when the relative positional deviation between the pattern in the shot area of the substrate and the pattern formed to the imprint material obtained in a previous shot area is not within an allowable range, formation of the pattern in the subsequent shot area is stopped.

4. The imprinting method according to claim 1, wherein the relative positional deviation between the pattern in the shot area of the substrate and the pattern formed to the imprint material is used for alignment between the mold and the substrate in a subsequent substrate when forming patterns on a plurality of substrates in sequence by
   executing the alignment between the mold and the substrate in the bringing the mold into contact with the imprint material,
   executing curing the imprint material and the forming a pattern, and then
   obtaining the relative positional deviation between the pattern in the shot area of the substrate and the pattern formed to the imprint material.

5. The imprinting method according to claim 1,
   wherein the mold includes a pattern surface having the pattern area formed on the pattern surface, and
   wherein the mold is moved in a direction parallel to the pattern surface after the space between the substrate and the mold has been increased, and then the inspection mark and the substrate mark are detected.

6. The imprinting method according to claim 1, wherein an operation of increasing the space between the substrate and the mold is performed in a state in which the substrate mark is positioned within the focal depth of the optical system.

7. The imprinting method according to claim 1, wherein an index of refraction of the imprint material in the mold mark is such that the mold mark cannot be detected by the optical system while the mold and the imprint material remain in contact with each other.

8. The imprinting method according to claim 1, wherein the inspection mark is a projection formed in a recess of the pattern in the shot area of the substrate.

9. The imprinting method according to claim 1, wherein the inspection mark is formed by the mold mark being transferred to the imprint material.

10. A device manufacturing method comprising:
    forming a pattern to an imprint material on a substrate by using an imprinting apparatus; and
    processing the substrate by using the pattern formed to the imprint material,
    wherein the imprinting apparatus is configured to bring a mold having a pattern area and a mold mark into contact with an imprint material supplied onto a substrate, cure the imprint material in a state in which the mold is in contact with the imprint material, and increase the space between the substrate and the mold, thereby forming a pattern to the imprint material and an inspection mark to the imprint material, on the substrate,
    wherein the substrate includes a shot area having a pattern including a substrate mark of the substrate formed on the substrate, the imprinting apparatus including:
    a drive unit configured to change the space between the substrate and the mold;
    a detecting unit configured to detect light from the inspection mark and light from the substrate mark, and
    a control unit configured to control operations of the drive unit and the detecting unit and obtain a relative positional deviation between the pattern formed on the substrate and the pattern formed to the imprint material from a result of detection by the detecting unit,
    wherein the detecting unit includes an optical system configured to detect light from the inspection mark and light from the substrate mark, and
    after the imprint material has been cured, the control unit causes the drive unit to increase the space between the substrate and the mold until the substrate mark is positioned out of a focal depth of the optical system, and then causes the detecting unit to detect the inspection mark and the substrate mark.

* * * * *